United States Patent
Cuzzocrea et al.

(10) Patent No.: US 9,884,756 B2
(45) Date of Patent: Feb. 6, 2018

(54) MEMS DEVICE WITH GETTER LAYER

(71) Applicant: TRONICS MICROSYSTEMS S.A., Crolles (FR)

(72) Inventors: Julien Cuzzocrea, Grenoble (FR); Joël Collet, Saint Martin d'Uriage (FR)

(73) Assignee: TRONICS MICROSYSTEMS S.A., Crolles (FR)

( * ) Notice: Subject to any disclaimer, the term of this patent is extended or adjusted under 35 U.S.C. 154(b) by 0 days.

(21) Appl. No.: 14/890,852

(22) PCT Filed: Jun. 5, 2014

(86) PCT No.: PCT/EP2014/001525
§ 371 (c)(1),
(2) Date: Nov. 12, 2015

(87) PCT Pub. No.: WO2014/198393
PCT Pub. Date: Dec. 18, 2014

(65) Prior Publication Data
US 2016/0107882 A1    Apr. 21, 2016

(30) Foreign Application Priority Data
Jun. 12, 2013    (EP) .................................... 13290136

(51) Int. Cl.
*B81B 7/00* (2006.01)
*B81C 1/00* (2006.01)

(52) U.S. Cl.
CPC ........ *B81B 7/0038* (2013.01); *B81C 1/00285* (2013.01)

(58) Field of Classification Search
USPC ........................................... 257/415; 438/50
See application file for complete search history.

(56) References Cited

U.S. PATENT DOCUMENTS 6,929,974 B2    8/2005  Ding et al.
8,414,963 B2 *  4/2013  Baillin .................. B81B 7/0038
                                                427/97.3
(Continued)

FOREIGN PATENT DOCUMENTS

DE    102004020685 B3    9/2005
WO    WO 03/009318 A2    1/2003
(Continued)

*Primary Examiner* — Marcos D Pizarro Crespo
*Assistant Examiner* — Lawrence Tynes, Jr.
(74) *Attorney, Agent, or Firm* — Birch, Stewart, Kolasch & Birch, LLP

(57) ABSTRACT

A MEMS device comprises a first layer (1), a second layer (2) and a third layer (3) sealed together. A mobile structure (7.1, 7.2) in the second layer (2) is defined by openings (8.1, 8.2) in the second layer (2). In the first layer (1), there is at least one first-layer cavity (6.1, 6.2) with an opening towards the mobile structure (7.1, 7.2) of the second layer (2). In the third layer (3), there is at least one third-layer cavity (9) with an opening towards the mobile structure (7.1, 7.2) of the second layer (2). Therefore, the third-layer cavity (9) and the second layer (2) define a space within the MEMS device, A getter layer (10.1, 10.2) arranged on a surface of said space. The getter layer (10.1, 10.2) is preferably arranged on a surface of the second layer (2) and in particular, the getter layer (10.1, 10.2) is arranged on a static part of the second layer (2). Alternatively, the MEMS device has a third-layer cavity (24) with at least two recesses (25.1, 25.2, 25.3) and the getter layer (26.1, 26.2, 26.3) is arranged on a surface of the recesses (25.1, 25.2, 25.3).

12 Claims, 4 Drawing Sheets

(56) References Cited

U.S. PATENT DOCUMENTS

| | | | |
|---|---|---|---|
| 2003/0138656 A1* | 7/2003 | Sparks | B32B 9/00 428/615 |
| 2004/0077117 A1 | 4/2004 | Ding et al. | |
| 2004/0112937 A1* | 6/2004 | Laermer | B81B 7/0064 228/101 |
| 2010/0025845 A1 | 2/2010 | Merz et al. | |
| 2010/0051810 A1* | 3/2010 | Herrmann | B81C 1/00293 250/338.1 |
| 2011/0048129 A1* | 3/2011 | Yamanaka | B81B 7/02 73/504.12 |
| 2013/0068020 A1* | 3/2013 | Aono | B81C 1/00293 73/504.12 |

FOREIGN PATENT DOCUMENTS

| | | | |
|---|---|---|---|
| WO | WO 2004/065289 A2 | 8/2004 | |
| WO | 1412550 B1 | 3/2009 | |

* cited by examiner

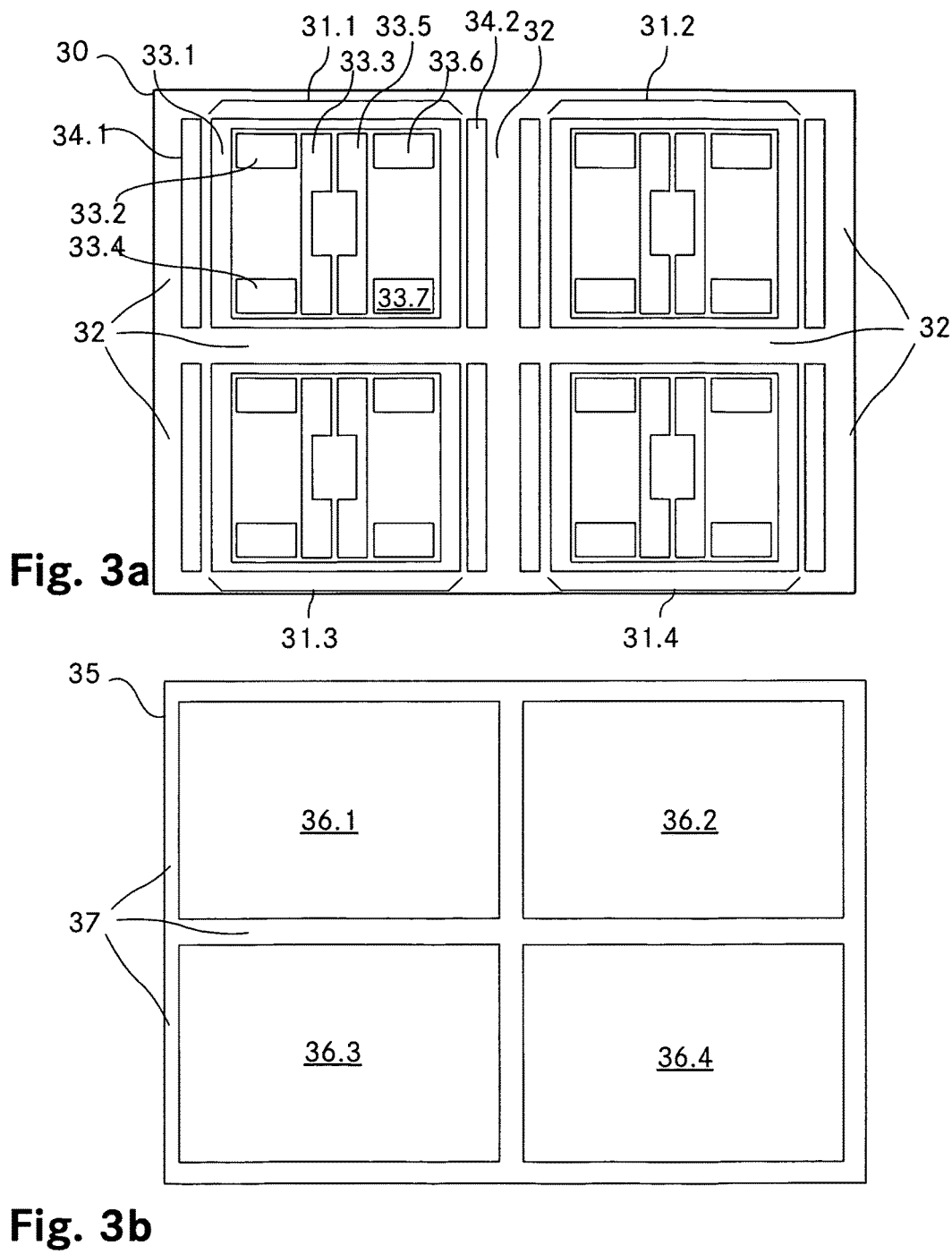

MEMS DEVICE WITH GETTER LAYER

TECHNICAL FIELD

The invention relates to a MEMS device comprising
a) a first layer, a second layer and a third layer sealed together,
b) a mobile structure in the second layer defined by openings in the second layer,
c) in the first layer at least one first-layer cavity with an opening towards the mobile structure of the second layer,
d) in the third layer at least one third-layer cavity with an opening towards the mobile structure of the second layer, wherein the third-layer cavity and the second layer commonly define a space within the MEMS device, The invention also refers to a method for manufacturing a MEMS device.

BACKGROUND

U.S. Pat. No. 6,929,974 B1 (Motorola) discloses a microdevice having a hermetically sealed cavity to house a microstructure between the substrate and the cap. The microstructure may be a gyroscope that is mounted on protrusions of the substrate (FIG. 1B of U.S. Pat. No. 6,929,974 B1). Alternatively the microstructure may be an element mounted on the rim of a recess of the substrate (FIG. 6B). The cap has one recess for each microstruture and in each recess there is an embedded crystalline silicon getter layer. The getter layer helps maintain the vacuum within the cavity. In one embodiment, the microdevice comprises a substrate, a cap and an isolation layer. A cavity is at least partially defined by a recess in the cap.

US 2010/0025845 A1 (Fraunhofer Institut) discloses a multiple element component which is to be subsequently individualized by forming elements containing active structures. The component comprises a flat substrate and also a flat cap structure which are bound to each other such that they surround at least one first and one second cavity per component which are sealed against each other and towards the outside. The first of the two cavities is provided with getter material and has—due to the getter material—a different internal pressure than the second cavity.

EP 1 412 550 B1 (Saes Getters) discloses a method for producing MEMS devices with integrated getter. The starting is the problem when using known CVD or sputtering steps for producing localized deposits of gas absorbing materials in the course of known solid state production steps. Obviously, EP 1 412 550 B1 is based on the presumption that localized deposition would imply resin deposition, local sensitization of resin, deposition of gas absorbing material and subsequent removal of sensitized resin and of gas absorbing material, so that the gas absorption material is left in the area from which the resin had been removed. This would increase the complexity of the device production and have the risk of cross-pollution. The goal of EP 1 412 550 B1 is to overcome the problems of the prior art with respect to the complexity of the production process. The surface of the support on which the MEMS devices are constructed has cavities or hollows. Said hollows are designed to form a space for housing mobile structures of the micromechanical devices that protrude from the base. The mobile structures are fixed to the top surface of the bottom part and rise up from said top surface. Therefore, the space provided by the hollow is necessary and sufficient for housing the mobile structure and the mobile structure projects into the space of the hollow and is surrounded by the hollow.

The prior art does not fulfill all needs of modern MEMS technology (MEMS=micro electro-mechanical system).

SUMMARY OF THE INVENTION

It is the object of the invention to create a MEMS device in the technical field initially mentioned. The device should maintain a vacuum in its cavity for the desired lifetime of the device and it should be easy to produce the measures for maintaining the vacuum.

The solution of the invention is specified by the features of claim 1. According to the invention the MEMS device comprises a first layer, a second layer and a third layer sealed together. The layers are flat and do not have to be physically separate elements. For instance, the first and the second layer may be joined to one physical unit. The first and second layer may form a base and the third layer may form a cap. The cap and the base are self supporting and can, therefore, be handled separately during the manufacturing process. Generally speaking, the three layers have the same extension in x and y direction (directions parallel to layers). The device may consist of more than three layers. Additional layers may be present between the three layers.

According to the invention a mobile structure is provided within the second layer. The mobile structure is defined by openings in the second layer. Therefore, the mobile structure does not extend into the realms of the first or third layer. Also, the mobile structure consists of the same material as the second layer. The openings penetrate the second layer. The openings define an element that may vibrate or accelerate in the x-y-plane or in z-direction.

In the first layer there is at least one first-layer cavity with an opening towards the mobile structure of the second layer. The cavity is at least coextensive with the mobile structure in x and y direction. Therefore, the mobile structure is free to vibrate or accelerate above the first-layer cavity.

In the third layer there is at least one third-layer cavity with an opening towards the mobile structure of the second layer. This cavity is at least coextensive with the mobile structure in x and y direction. Typically the cavity is larger in x-y direction than the mobile structure. The third-layer cavity and the second layer (i.e. the surface of the second cavity that is oriented towards the third layer) define an inner surface enclosing a space within the MEMS device. Said space is sufficient to avoid crashing of the mobile structure into the third layer. It may be used for placing electrodes to drive or detect the movement of the mobile structure. However, the cavity is not for housing the mobile structure because the mobile structure is completely within the second layer.

According to the invention, at least one getter layer is arranged on the inner surface of said space between the second and the third layer. The getter layer is made of a material that adsorbs gas molecules that may be present in the space after sealing the three layer structure.

Getter materials are known in the art. They may comprise Zr, Ti, Nb, Ta, V, alloys of these metals and alloys further containing Cr, Mn, Fe, Co, Ni, Al, Y, La and Rare Earths (see e.g. WO 2004/065289).

According to a specific embodiment of the invention the at least one getter layer is arranged on a surface of the second layer. This avoids depositing getter material on the third layer.

Preferably, the at least one getter layer is arranged on a static part of the second layer. That means that the getter is not on the mobile structure and that there is no risk to change the characteristics of the mobility of the mobile mass. Alternatively, the getter layer may cover the mobile structure. In particular the getter layer covers the seismic mass (or vibratory mass) but not the flexible beams or spring elements that support the seismic mass (or vibratory mass).

If the getter layer is on the mobile structure, it is advantageous to separate the getter material on the mobile part into a number of stripes or elements to maintain the elastic modulus of the MEMS layer. The extension of the separate elements is e.g. 10 times the thickness of the getter layer. Generally speaking, the getter layer has a maximum thickness in the range of 0.1 to 3 micron, preferably of 0.5 to 3 micron. So, the extension of the getter layer elements in x- or y-direction may be in the range of 10-100 micron, more preferably in the range of 50-100 micron.

According to a specific embodiment, the third-layer cavity has at least two recesses and the getter layer is arranged on a surface of the recesses. The recesses may have a greater depth than the general level of the third-layer cavity.

Preferably, the third-layer cavity is larger (in x and y direction) than the mobile structure. Additionally, the recesses are smaller than the mobile structures. That means that there may be a number of relatively small recesses containing separate getter layers.

In a specific embodiment of the invention the second layer is a semiconductor on insulator (SOI) layer. The insulator layer is an additional layer between the first layer (which may be a silicon substrate fabricated from a standard silicon wafer) and the second layer. The mobile structure is etched into the semiconductor and the insulator layer. There are other techniques to implement the three layers.

The first layer consists typically of a non-conducting material. For the purpose of contacting the electrodes, which are in the MEMS device for activating or reading the movement of the mobile structure, the first layer comprises conductive structures penetrating the first layer. The electrodes inside the MEMS device may also be contacted by electrical conductors penetrating the third layer.

A method for manufacturing a MEMS device of the invention comprises the steps of:
a) providing three layers, wherein a first layer of said layers has at least one first-layer cavity, a second layer has openings for defining a mobile structure and a third layer has at least one third-layer cavity,
b) providing a getter layer on an area defined by the third-layer cavity and by a top surface of the second layer,
c) sealing the three layers together for providing at least one sealed inner space, in such a way that the first-layer cavity and the third-layer cavity have their opening towards the mobile structure of the second layer.

The three layers may be manufactured separately prior to the use in the process of the invention. Preferably, the invention uses a combined structure consisting of (at least) the first and second layer (which is most preferably a silicon substrate with a SOI structure on top). The third layer is separate from the first and second layer.

The second layer may already contain the mobile structure prior to starting the process of the invention. However, it is also possible to manufacture the openings in the second layer during the process according to the invention. That is, the second layer may be provided as raw plate without any mobile structure.

The getter material is provided on the second layer or in the third-layer cavity. Generally speaking, the getter material will not cover all the inner surface but only some part of it. Preferably, the getter material is deposited only in areas where it is finally needed. Alternatively, the getter may be provided, in a first step, on the whole main face of the second layer. Then the getter material may be removed in area sections where it is not needed.

When the getter is provided in the desired areas of the third-layer cavity or of the second layer, the three layers are sealed together in such a way that the first-layer cavity and the third-layer cavity have their opening towards the mobile structure of the second layer. The third-layer cavity contains a vacuum or a controlled gas filling. The getter material is selected in such a way that it absorbs any undesired gas molecules in the cavities. In case the cavity is filled with a noble gas (=controlled gas filling), it is clear that the getter is selected such that the noble gas is not absorbed.

The method is suitable for wafer level packaging. That means, that the first and the third layer are wafers of suitable thickness and have a number of identical structures. In other words: There are several mobile structures, several first-layer cavities and several third-layer cavities. The step of sealing the three layers to each other results in a multi-unit device having a plurality of hermetically sealed inner spaces. The sealed layer structure can then be cut into separate chips, each of the chip comprising at least one mobile structure sealed in an evacuated cavity.

Other advantageous embodiments and combinations of features come out from the detailed description below and the totality of the claims.

BRIEF DESCRIPTION OF THE DRAWINGS

The drawings used to explain the embodiments show:
FIG. 3a, b a schematic top plan view of the base plate and the cap plate of the first embodiment.

PREFERRED EMBODIMENTS

Figure 1:
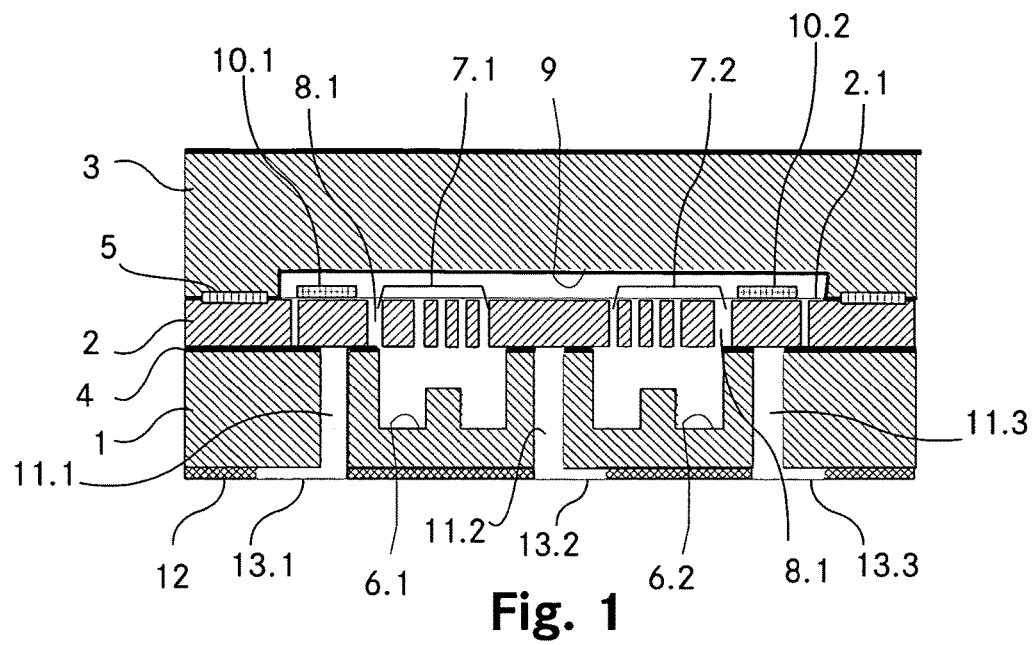
FIG. 1 a schematic cross-section of a first embodiment of the invention.

FIG. 1 shows a cross-section of the first preferred embodiment. The first layer is a silicon substrate 1 having a thickness in the range of e.g. 200-750 micron. The substrate 1 is sufficiently thick (i.e. self supporting structure) to be handled separately from the other layers during the production process. On top of the substrate 1 there is a much thinner insulator layer 4 (for instance an oxide layer having a thickness of up to a few microns, e.g. 0.1 to 3 micron). On top of the insulator layer 4 there is the MEMS layer 2 (which corresponds to the "second layer" according to the terminology of the invention). The MEMS layer 2 may be a crystalline silicon layer, which is suitable for building the mobile structure. The MEMS layer 2 has a thickness of not less than 10 micron, preferable a thickness in the range of 20-100 micron (e.g. 60 micron). On top of the MEMS layer 2, there is a cap 3 (which corresponds to the "third layer" in the terminology of the invention). This layer may have a thickness of 200-750 micron, e.g. 300 micron.

An alternative is a SOI layer composed of a thin layer of Si (100 to 500 nm), an oxide layer in the range of 0 to 2 micron, a thick Si layer in the range of 10 to 60 micron.

The substrate 1 and the silicon on insulater (SOI) component (i.e. the MEMS layer 2 in combination with insulator layer 4) may be sealed together by well known methods. The cap 3 may be bonded to the top surface 2.1 by means of a metallic sealing layer 5. (There are also other ways for sealing such as silicon direct bonding at low temperature.)

Inside the device the substrate 1 has for example two cavities 6.1, 6.2. Above each cavity 6.1, 6.2 there is a mobile structure 7.1, 7.2 in the MEMS layer 2. Said mobile structures 7.1, 7.2 are defined by openings 8.1, 8.2 in the MEMS layer 2. The mobile structures 7.1, 7.2 may be two seismic masses suspended by spring elements above the cavity 6.1, 6.2. The seismic mass reacts to accelerations of the device. Otherwise, the mobile structure may be a tuning fork, comprising two mobile parts performing anti-phase movements.

Above the mobile structures 7.1, 7.1 there is one single third-layer cavity 9, which spans over the area of the two mobile structures. 7.1, 7.2. The depth of the said cavity 9 is smaller than the thickness of the MEMS layer 2 and may be in the range of 1-30 micron, e.g. 15 micron. The cavity 9 is not for housing the mobile structures 7.1, 7.2 because the mobile structures are fully contained in the MEMS layer 2 and do not extend into the cavity 9.

The cavity 9 is larger in x and y direction than the mobile structures 7.1, 7.2. That means that there is a top surface area of the MEMS layer 2 that surrounds the mobile structures 7.1, 7.2. This area represents a static part of the MEMS layer 2 and is suited for placing getter layers 10.1, 10.2.

Due to the openings 8.1, 8.2 the cavities 6.1, 6.2 in the substrate 1 and the cavity 9 in the cap 3 are in gas exchange with each other. Therefore, the getter layer 10.1, 10.2 maintains the vacuum (or the inert gas atmosphere) in all three cavities 6.1, 6.2, 9.

In the present embodiment, the electrodes inside the MEMS device are connected to the outside via the substrate 1. The substrate 1 has a plurality of penetrations filled with an electrical conductor 11.1, . . . , 11.3. The bottom surface of the substrate 1 is covered with a polymer layer 12. In some regions of the bottom surface there is no polymer layer 12 and there are contact pads 13.1, . . . , 13.3 for contacting the electrical conductors 11.1, . . . , 11.3. The contact pads 13.1, . . . , 13.3 are made of appropriate electrical conductors. Preferably, contact pads 13.1, . . . , 13.3 consist of a stack of several layers of different metals.

At this juncture, it is to be noted, that the invention is not limited to a particular MEMS device. It is not crucial whether the MEMS device is a tuning-fork type device or whether it is some other type of sensor or actuator. Therefore, depending on the design of the device, there may be just one cavity or there may be more than two cavities in the substrate 1. Also, there may be just one mobile structure or there may be more than two mobile structures above the substrate.

Figure 2:
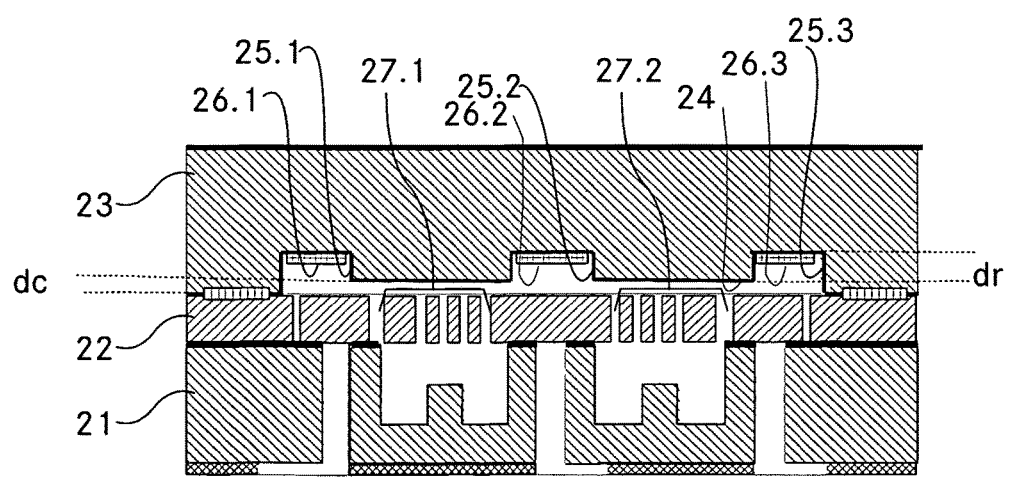
FIG. 2 a schematic cross-section of a second embodiment of the invention.

FIG. 2 shows an embodiment that uses selected recesses in the cavity of the cap for placing the getter material. While the substrate 21 and the MEMS layer 22 may be of the same construction as in FIG. 1, the cap 23 is different. The cavity 24 has several (e.g. three) recesses 25.1, . . . , 25.3 separated by regions of the cavity 24 having a smaller depth. The recesses 25.1, . . . , 25.3 may be arranged off-side the area of the mobile structures 27.1, 27.2 in the MEMS layer 22. In the recesses 25.1, . . . , 25.3 there are layers of getter material 26.1, . . . , 26.3.

The advantage of the embodiment of FIG. 2 is that there is more area available for exposing the getter material 26.1, . . . , 26.3. The recesses in the cavity of the cap may also be placed face to face to the area of the mobile structure. The number of recesses and the total area of the getter material depends on the expected lifetime of the device.

FIG. 3*a*, *b* illustrates the production of the MEMS device of FIG. 1. The first and the second layer are combined to a plate 30. (FIG. 3*a* shows the top plan view on the second layer, i.e. on the MEMS layer. On the plate 30, there is a plurality (in the simplified representation of FIG. 3*a* only four) identical device structures 31.1, . . . , 31.4, which are separated from each other by a frame area 32 for sealing the plate 30 to the cap (FIG. 3*b*).

In the present embodiment each device structure comprises a tuning-fork-type mobile element with two masses vibrating in anti-phase. Such structures are well-known in the art and the present invention is not directed to a specific structure. As shown in FIG. 3*a*, openings 33.1, . . . , 33.7 define the shape of the mobile structure.

Two areas of getter layers 34.1, 34.2 are provided outside of the opening 33.1 and inside the frame area 32.

FIG. 3*b* shows the cap plate 35 which has the same number of cavities 36.1, . . . , 36.4 as there are device structures 31.1, . . . , 31.4 in the base plate 30. Each of the cavities 36.1, . . . , 36.4 covers an area that corresponds to the area of the corresponding device structure. The cavities 36.1, . . . , 36.4 are separated by a rim area 37 which fits the frame area 32.

When the getter material is deposited on the surface of the base plate 30, the cap plate 35 is sealed to the base plate via the rim area 37. Afterwards, the device is cut into chips, each chip containing at least one device structure 31.1, . . . , 31.4. In the present simplified representation the device may be cut into four pieces of equal size.

Figure 4A:
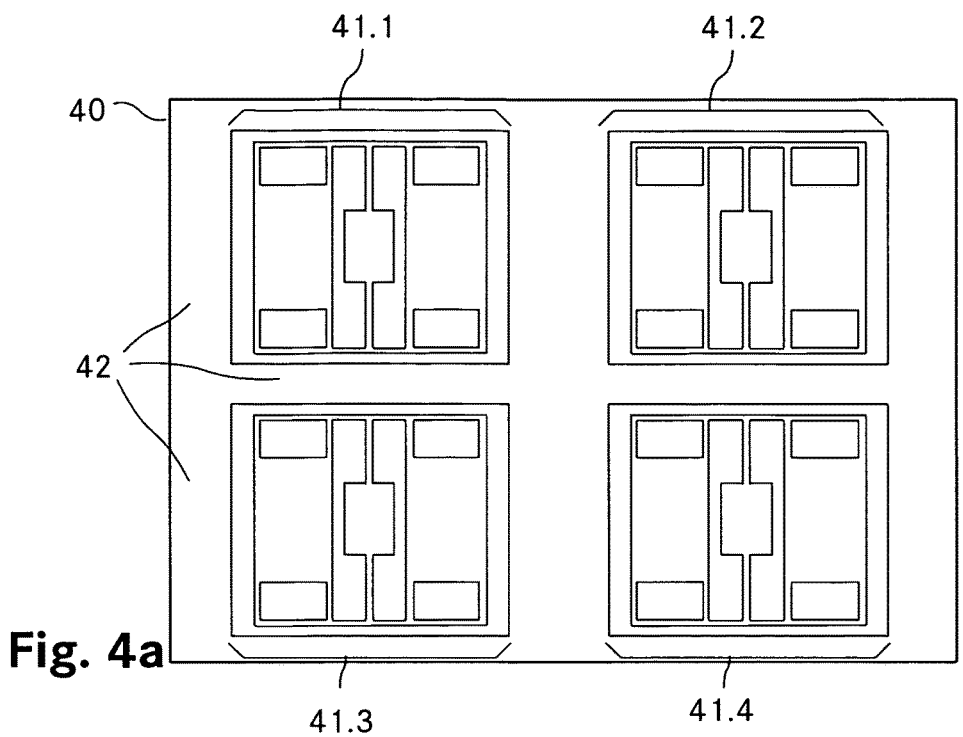
FIG. 4 a schematic top plan view of the base plate and the cap plate of the second embodiment.
Figure 4B:
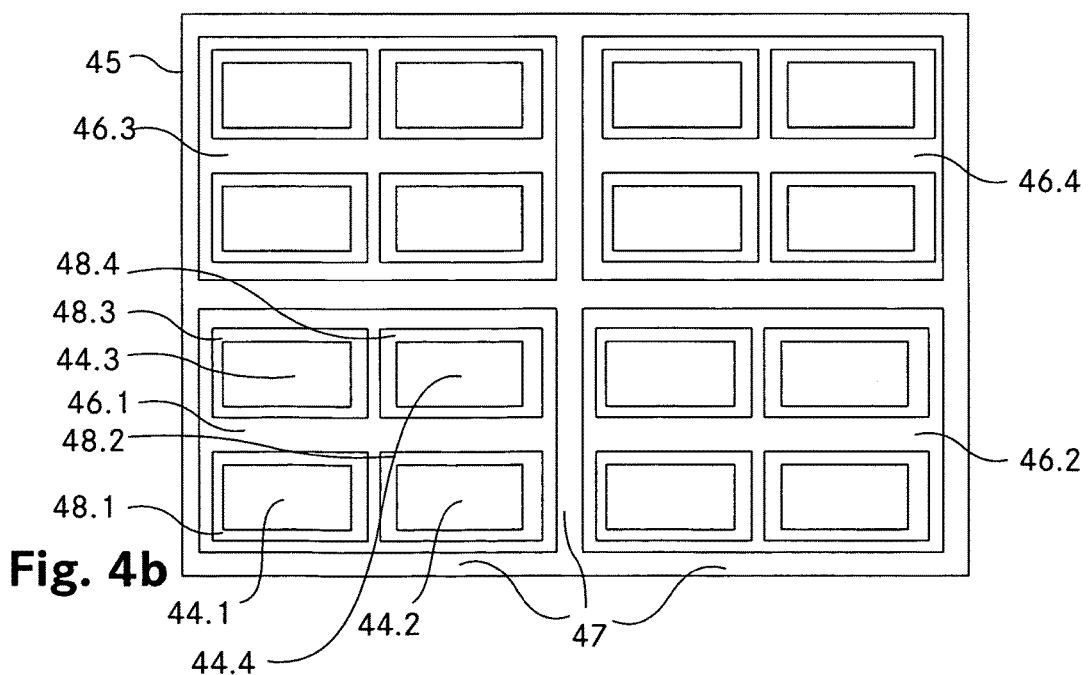

FIG. 4*a*, *b* illustrate the production process for the embodiment of FIG. 2. The base plate 40 may have the same structure as the base plate shown in FIG. 3*a* with the exception of the getter layer. There are no getter layers on the base plate 40. In the simplified representation of FIG. 4*a* there are four identical device structures 41.1, . . . , 41.4 in a frame area 42 surrounding each of the device structures 41.1, . . . , 41.4.

The cap plate 45 is different from the embodiment shown in FIG. 3*b*, because each of the cavities 46.1, . . . , 46.4, each covering the corresponding device structure 41.1, . . . , 41.4 in the base plate 40, has four recesses 48.1, . . . , 48.4. The cavities 46.1, . . . , 46.4 may be quite shallow and may have a depth of a few microns (e.g. 5 micron). The four recesses 48.1, . . . , 48.4 have a greater depth of e.g. 20-40 micron with respect to the level of the cavities 46.1. The bottom of the recesses have a level that corresponds to the sum of the depth of the cavity 46.1 (see "dc" in FIG. 2) and the depth of the recess 48.1 (see "dr" in FIG. 2).

In each recess 48.1, . . . , 48.4 there is a getter layer 44.1, . . . , 44.4.

The base plate 40 and the cap plate 45 are connected to each other via the frame area 42 of the base plate 40 and the rim area 47 of the cap plate 45.

FIG. 5*a*-*e* illustrate the manufacturing process according to the invention. First, the first two layers, namely the substrate 1 and the MEMS-layer 2 are provided. The substrate 1 has an array (e.g. 5'5) of device units, each having two cavities 6.1, 6.2. For each device unit the MEMS-layer 2 has two mobile structures 7.1, 7.2.

In a next step (shown in FIG. 5*b*), two getter layers 10.1, 10.2 are deposited for each device unit on the MEMS layer 2. In the present embodiment, the getter layers 10.1, 10.2 are deposited to the left and to the right of the mobile structures 7.1, 7.2 (see FIG. 1 and FIG. 3*a*).

Figure 5A:
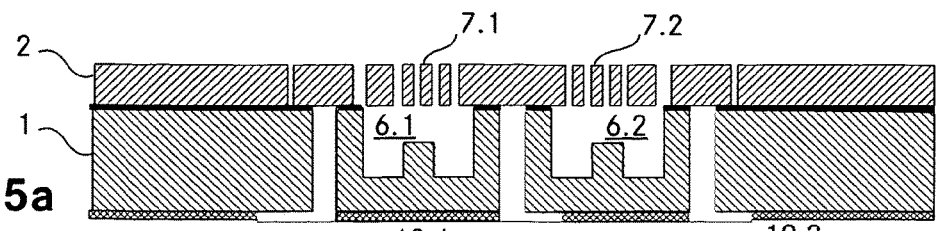
FIG. 5a-e a schematic diagram illustrating the preferred manufacturing process.
Figure 5B:
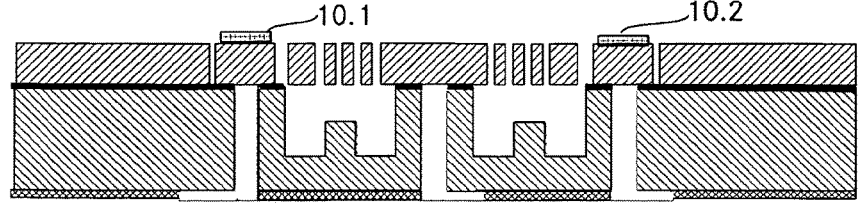
Figure 5C:
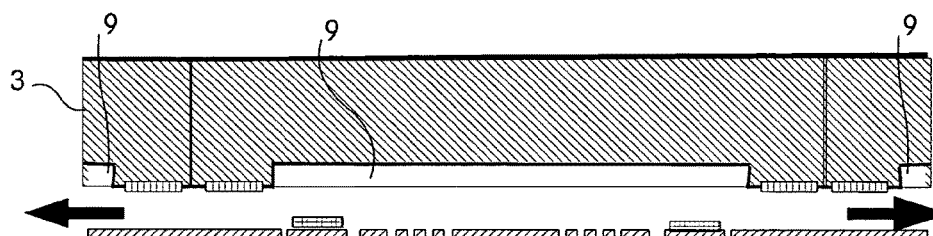

As shown in FIG. 5c, a cap 3 is provided. The cap has an array of cavities 9, one cavity for each device structure. If there is e.g. an array of 5×5 device structures in the MEMS layer 2, there is a corresponding array of 5×5 cavities 9 in the cap 3.

Figure 5D:
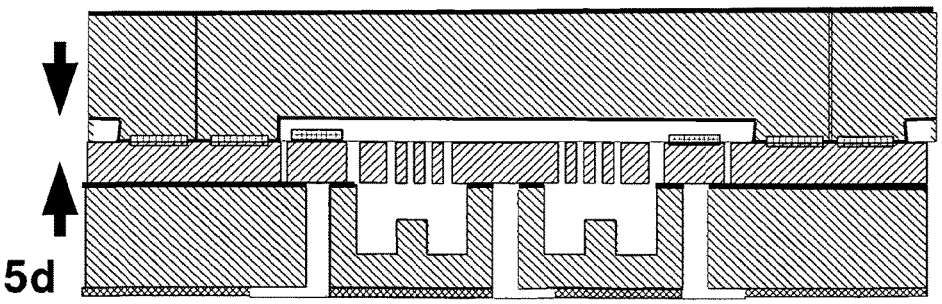

Then the atmosphere is evacuated and the getter material is activated (FIG. 5c) during bonding the cap 3 to the top surface of the MEMS-layer 2 (FIG. 5d).

Figure 5E:
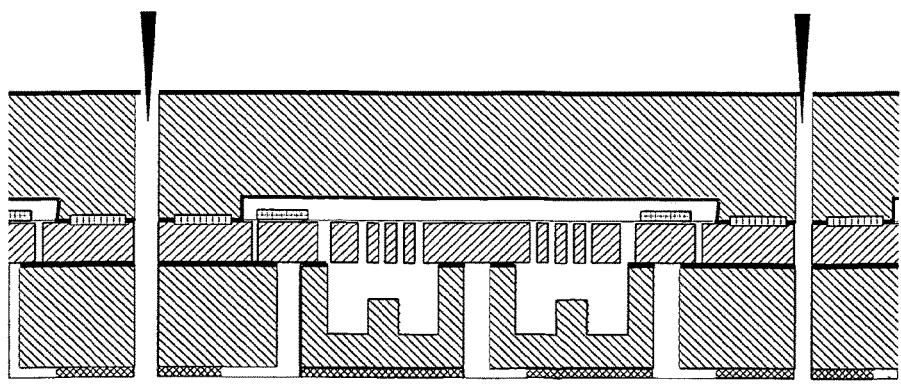

Finally the wafer package (consisting of the substrate 1, the MEMS-layer 2 and the cap 3) is divided into single units, each unit comprising a device structure (FIG. 5e).

The device shown in FIG. 2 can be fabricated in an analogous way. The main difference to FIG. 5a-e will be that the getter material is deposited in the cavities of the cap layer instead of on the MEMS-layer 2.

The invention is not limited to the embodiments shown in the figures. A number of modifications is possible. The getter material may also be provided on an anchor area of the mobile structure since such an area is also static. That means that in the embodiment of FIG. 1 the static area between the two mobile structures 7.1, 7.2 may additionally (or alternatively) be used for the getter layer. It is also possible to provide a getter material on the MEMS layer 2 as well as in the cavity 9 of the cap 3. In such an arrangement it is not necessary that the cavity 9 has additional recesses. From the point of view of production it is, however, a little bit more complex to provide getter layers on the MEMS-layer as well as in the cap cavity.

The number of areas with a getter layer depends on the design of the device. While in the examples there are two stripe-shaped getter layers, there may be also more than two areas with getter material. Preferably, the invention uses at least two getter layers.

The manufacturing process is not explained in detail, since it is known in the art, how to seal semiconductor layers to each other. Also the technical details of providing getter material on a substrate is known.

While the figures show specific ways e.g. for electrically contacting the inside of the MEMS device or for designing the mobile structure, these details are not limiting the scope of the invention which relates to the arrangement of the getter material in the cavity.

In summary, the invention provides a wafer level packaging method with integrated getter material. It is easy to implement the invention in different production processes.

The invention claimed is:

1. A MEMS device comprising:
    a) a first layer, a second layer and a third layer sealed together,
    b) a mobile structure in the second layer defined by openings in the second layer,
    c) in the first layer at least one first-layer cavity with an opening towards the mobile structure,
    d) in the third layer at least one third-layer cavity with an opening towards the mobile structure, wherein the third-layer cavity and the second layer define an inner surface enclosing a space within the MEMS device,
    e) at least one getter layer arranged on said inner surface, wherein the third-layer cavity is larger than the mobile structure and includes recesses that are smaller than the mobile structures.

2. A MEMS device according to claim 1, wherein the at least one getter layer is arranged on a surface of the second layer.

3. A MEMS device according to claim 2, wherein the at least one getter layer is arranged on a static part of the second layer.

4. A MEMS device according to claim 3, wherein the third-layer cavity has at least two recesses and wherein at least two getter layers are arranged on a surface of said recesses.

5. A MEMS device array comprising at least two MEMS devices according to claim 4, wherein the recesses are outside a cavity for housing the mobile structure.

6. A MEMS device according to claim 1, wherein the second layer is a semiconductor on insulator (SOI) layer.

7. A MEMS device according to claim 1, wherein the first layer comprises conductive structures penetrating the first layer.

8. A method for manufacturing a MEMS device, comprising the steps of:
    a) providing three layers, wherein a first layer of said three layers has at least one first-layer cavity, a second layer has openings for defining a mobile structure and a third layer has at least one third-layer cavity,
    b) sealing the three layers together for providing at least one sealed inner space, in such a way that the first-layer cavity and the third-layer cavity have their opening towards the mobile structure of the second layer,
    c) prior to sealing the three layers together at least one getter layer is provided on said inner surface, wherein the third-layer cavity is larger than the mobile structure and includes recesses that are smaller than the mobile structures.

9. A method according to claim 8, wherein the layers have several mobile structures, several first-layer cavities and several third-layer cavities and therein the three layers are sealed together for providing a plurality of sealed inner spaces.

10. A method according to claim 9, wherein the sealed layers are cut into chips, each chip containing at least one mobile structure.

11. A method according to claim 8, wherein the at least one getter layer is arranged on a surface of the second layer.

12. A method according to claim 8, wherein the third-layer cavity has at least two recesses and wherein at least two getter layers are arranged on a surface of said recesses.

* * * * *